United States Patent
Long et al.

(10) Patent No.: US 11,626,694 B2
(45) Date of Patent: Apr. 11, 2023

(54) ELECTRICAL SHIELDING FOR A RECEPTACLE CONNECTOR ASSEMBLY

(71) Applicant: TE Connectivity Services GmbH, Schaffhausen (CH)

(72) Inventors: Richard James Long, Columbia, PA (US); Steven David Dunwoody, Middletown, PA (US); Alex Michael Sharf, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 17/202,939

(22) Filed: Mar. 16, 2021

(65) Prior Publication Data
US 2022/0302651 A1 Sep. 22, 2022

(51) Int. Cl.
*H01R 13/658* (2011.01)
*H01R 13/6581* (2011.01)
*H05K 1/18* (2006.01)
*H01R 12/73* (2011.01)
*H01R 12/72* (2011.01)

(52) U.S. Cl.
CPC ....... *H01R 13/6581* (2013.01); *H01R 12/721* (2013.01); *H01R 12/73* (2013.01); *H05K 1/18* (2013.01); *H05K 2201/10189* (2013.01); *H05K 2201/10371* (2013.01)

(58) Field of Classification Search
CPC .. H01R 13/6581; H01R 12/721; H01R 12/73; H05K 2201/10189; H05K 2201/10371
USPC ....................................................... 439/487
See application file for complete search history.

(56) References Cited

U.S. PATENT DOCUMENTS

| | | | | |
|---|---|---|---|---|
| 5,524,908 A * | 6/1996 | Reis | ..................... | H05K 9/0015 174/358 |
| 7,375,291 B2 * | 5/2008 | Ariel | ................... | H05K 9/0015 174/370 |
| 7,491,900 B1 * | 2/2009 | Peets | ..................... | H05K 9/0016 174/382 |
| 8,599,559 B1 * | 12/2013 | Morrison | ............. | H05K 9/0058 361/702 |
| 8,759,692 B2 * | 6/2014 | Bunyan | ................ | H05K 9/0016 174/358 |

(Continued)

FOREIGN PATENT DOCUMENTS

| | | | | |
|---|---|---|---|---|
| CN | 104977664 B | * | 5/2017 | ........... G02B 6/4261 |
| CN | 208590214 U | * | 3/2019 | ........... H05K 9/0015 |
| WO | WO-2014193520 A1 | * | 12/2014 | ............... B64C 1/14 |

*Primary Examiner* — Peter G Leigh

(57) ABSTRACT

A receptacle connector assembly includes a receptacle cage including cage walls including a top wall and forming a module channel configured to receive a pluggable module. The top wall includes an opening open to the pluggable module. The receptacle connector assembly includes an EMI gasket coupled to the top wall at the opening. The EMI gasket provides electrical shielding at the opening. The EMI gasket has a base including a mounting surface coupled to the top wall of the receptacle cage. The EMI gasket has a plurality of mating interfaces. The receptacle connector assembly includes a heat sink coupled to the receptacle cage having a heat sink base with a thermal interface located in the module channel and configured to engage the pluggable module to dissipate heat from the pluggable module. The base engages the mating interfaces of the EMI gasket to electrically connect the heat sink to the EMI gasket.

20 Claims, 9 Drawing Sheets

(56) References Cited

U.S. PATENT DOCUMENTS

| | | | | |
|---|---|---|---|---|
| 8,766,108 B2* | 7/2014 | Bunyan | ............... | H02G 13/00 |
| | | | | 174/358 |
| 9,325,100 B2* | 4/2016 | Hirschy | ............... | H01R 13/46 |
| 9,532,490 B2* | 12/2016 | Bandhu | ............... | H05K 9/0015 |
| 9,820,382 B2* | 11/2017 | Wu | ............... | H01R 13/518 |
| 9,924,615 B2* | 3/2018 | Bucher | ............ | H05K 7/20445 |
| 10,193,281 B1* | 1/2019 | Rossman | ............ | H05K 9/0018 |
| 2004/0012939 A1* | 1/2004 | Ta | ............... | G06F 1/182 |
| | | | | 361/800 |
| 2013/0048367 A1* | 2/2013 | Ljubijankic | ....... | H01R 13/6583 |
| | | | | 174/354 |
| 2014/0153192 A1* | 6/2014 | Neer | ............... | G02B 6/4277 |
| | | | | 361/704 |
| 2016/0176497 A1* | 6/2016 | Coppola | ............ | B64C 1/1461 |
| | | | | 174/358 |
| 2016/0208919 A1* | 7/2016 | Dry | ............... | B64D 37/32 |
| 2021/0028581 A1* | 1/2021 | Hamner | ............ | H01R 13/65917 |

* cited by examiner

ELECTRICAL SHIELDING FOR A RECEPTACLE CONNECTOR ASSEMBLY

BACKGROUND OF THE INVENTION

The subject matter herein relates generally to receptacle connector assemblies.

Some communication systems utilize receptacle assemblies having communication connectors to interconnect various components of the system for data communication. The receptacle assemblies include receptacle cages that receive pluggable modules, such as I/O modules, that are electrically connected to the communication connector. The receptacle cages provide electrical shielding, such as EMI shielding, for the pluggable modules. Some known communication systems provide heat sinks attached to the receptacle cage to dissipate heat from the pluggable module. The heat sinks are typically mounted to the top of receptacle cage by a clip or spring that provides downward force to press the heat sink into the receptacle cage to interface with the pluggable module and force the heat sink through an opening in the top wall of the receptacle cage to interface with the pluggable module. Known receptacle cages are not without disadvantages. For instance, the opening in the top wall of the receptacle cage provides an area for potential EMI leakage.

A need remains for a receptacle cage having improved EMI shielding.

BRIEF DESCRIPTION OF THE INVENTION

In one embodiment, a receptacle connector assembly is provided. The receptacle connector assembly includes a receptacle cage including cage walls including a top wall. The cage walls form a module channel configured to receive a pluggable module. The cage walls extend between a front end and a rear end of the receptacle cage. The top wall includes an opening open to the pluggable module. The receptacle connector assembly includes an EMI gasket coupled to the top wall at the opening. The EMI gasket provides electrical shielding at the opening. The EMI gasket has a base including a mounting surface. The mounting surface of the base of the EMI gasket is coupled to the top wall of the receptacle cage. The EMI gasket has a plurality of mating interfaces. The receptacle connector assembly includes a heat sink coupled to the receptacle cage. The heat sink includes a heat sink base having a thermal interface. The thermal interface is located in the module channel and configured to engage the pluggable module to dissipate heat from the pluggable module. The base engages the mating interfaces of the EMI gasket to electrically connect the heat sink to the EMI gasket.

In another embodiment, a receptacle connector assembly is provided. The receptacle connector assembly includes a receptacle cage including cage walls including a top wall. The cage walls form a module channel configured to receive a pluggable module. The cage walls extend between a front end and a rear end of the receptacle cage. The top wall includes an opening open to the pluggable module. The top wall includes an inner surface and an outer surface. The inner surface faces the module channel. The receptacle connector assembly includes a heat sink coupled to the receptacle cage. The heat sink includes a heat sink base having a thermal interface. The thermal interface is located in the module channel and is configured to engage the pluggable module to dissipate heat from the pluggable module. The receptacle connector assembly includes an EMI gasket electrically coupled to the top wall and electrically coupled to the base of the heat sink. The EMI gasket surrounds the opening to provide electrical shielding at the opening. The EMI gasket has a base and a plurality of mating interfaces. The EMI gasket extends into the module channel to engage at least one of the top wall and the heat sink.

In a further embodiment, a communication system is provided. The communication system includes a pluggable module including an outer housing extending between a mating end and a cable end. The pluggable module includes an upper wall and a lower wall. The pluggable module has a cavity between the upper wall and the lower wall. The pluggable module has a module circuit card in the cavity including a card edge proximate to the mating end of the outer housing. The communication system includes a receptacle connector assembly including a receptacle cage having cage walls forming a module channel receiving the pluggable module. The cage walls include a top wall having an opening. The cage walls extend between a front end and a rear end of the receptacle cage. The receptacle connector assembly includes a communication connector having a card slot received in the receptacle cage proximate to the rear end. The pluggable module is loaded into the module channel to mate the card edge of the module circuit card with the communication connector. The receptacle connector assembly includes an EMI gasket coupled to the top wall at the opening providing electrical shielding at the opening. The EMI gasket has a base including a mounting surface. The mounting surface of the base of the EMI gasket is coupled to the top wall of the receptacle cage. The EMI gasket has a plurality of mating interfaces. The receptacle connector assembly includes a heat sink coupled to the receptacle cage. The heat sink includes a heat sink base having a thermal interface. The thermal interface is located in the module channel to engage the pluggable module to dissipate heat from the pluggable module. The base engages the mating interfaces of the EMI gasket to electrically connect the heat sink to the EMI gasket.

DETAILED DESCRIPTION OF THE INVENTION

Figure 1:
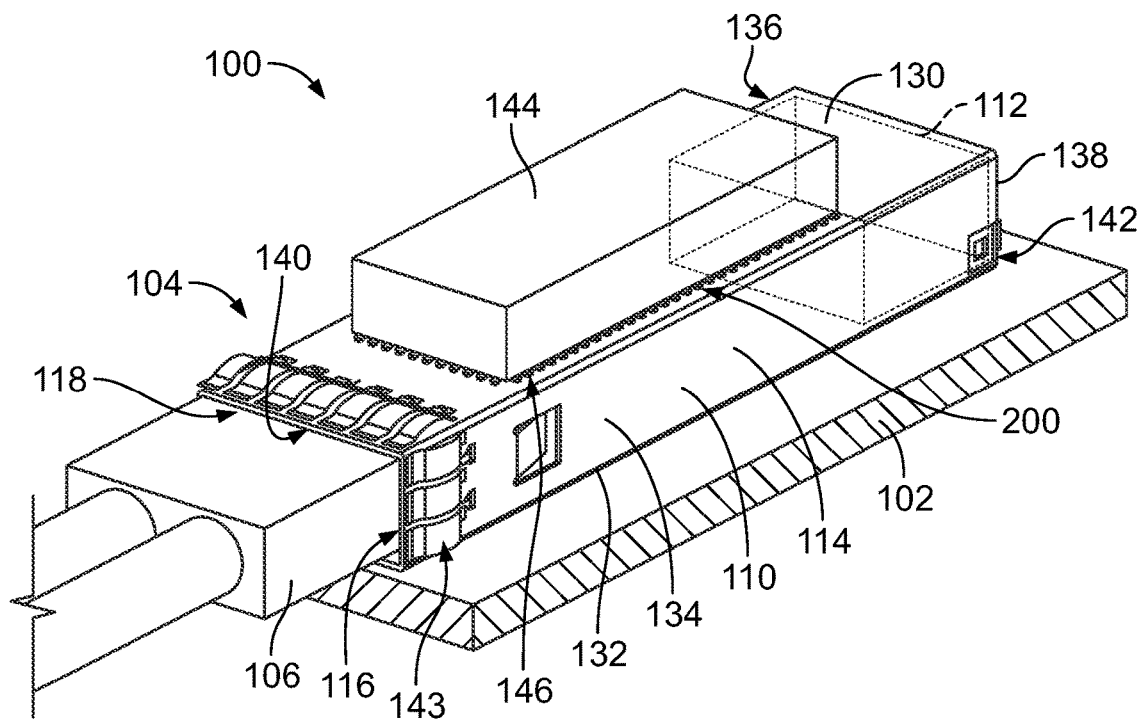
FIG. 1 is a front perspective view of a communication system formed in accordance with an exemplary embodiment.

FIG. 1 is a front perspective view of a communication system 100 formed in accordance with an exemplary embodiment. The communication system 100 includes a circuit board 102 and a receptacle connector assembly 104 mounted to the circuit board 102. A pluggable module 106 (shown in FIG. 2) is configured to be electrically connected to the receptacle connector assembly 104. The pluggable module 106 is electrically connected to the circuit board 102 through the receptacle connector assembly 104.

In an exemplary embodiment, the receptacle connector assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 encloses and provides electrical shielding for the communication connector 112. The receptacle cage 110 is configured to surround at least a portion of the pluggable module 106 to provide shielding for the pluggable module 106.

The receptacle cage 110 includes a plurality of cage walls 114 surrounding a cavity 116. The cavity 116 may receive the communication connector 112 in various embodiments. The cavity 116 defines one or more module channels 118 for receipt of corresponding pluggable modules 106. The cage walls 114 may be walls defined by solid sheets, perforated walls to allow airflow therethrough, walls with cutouts, such as for a heat sink or heat spreader to pass therethrough, or walls defined by rails or beams with relatively large openings, such as for airflow therethrough. In an exemplary embodiment, the receptacle cage 110 is a metallic shielding, stamped and formed cage member with the cage walls 114 being shielding walls.

In the illustrated embodiment, the receptacle cage 110 includes a single module channel 118 for receiving a single pluggable module 106. The receptacle cage 110 has a port that is open at the front of the receptacle cage 110 to receive the pluggable module 106. Any number of module channels 118 may be provided in various embodiments. For example, the receptacle cage 110 may constitute a stacked cage member having upper and lower module channels 118 to receive multiple pluggable modules 106 in a stacked arrangement in an alternative embodiment. The upper and lower module channels 118 may be arranged in a single column; however, the receptacle cage 110 may include multiple columns of ganged module channels 118 in alternative embodiments (for example, 2X2, 3X2, 4X2, 4X3, etc.). In other various embodiments, rather than being a stacked cage member, the receptacle cage 110 may include ganged module channels 118 in a single row (for example, 1X2, 1X4, etc.). Optionally, multiple communication connectors 112 may be arranged within the receptacle cage 110, such as when multiple columns or rows of module channels 118 are provided.

In an exemplary embodiment, the cage walls 114 of the receptacle cage 110 include a top wall 130, a bottom wall 132, a first side wall 134, a second side wall 136 and a rear wall 138. The top wall 130 includes an opening 150 (shown in FIG. 3) therethrough. The opening 150 provides access to the module channel 118 and the pluggable module 106. The bottom wall 132 may rest on the circuit board 102. However, in alternative embodiments, the receptacle cage 110 may be provided without the bottom wall 132. The receptacle cage 110 extends between a front end 140 and a rear end 142. The port is provided at the front end 140 to receive the pluggable module 106 through the front end 140. The cage walls 114 define the cavity 116. For example, the cavity 116 may be defined by the top wall 130, the bottom wall 132, the side walls 134, 136 and the rear wall 138. Other cage walls 114 may separate or divide the cavity 116 into a plurality of module channels 118, such as stacked or ganged module channels. For example, the cage walls 114 may include a divider (not shown). The divider may be a horizontal divider positioned between upper and lower module channels 118. In other various embodiments, the divider may define a vertical separator panel (not shown), such as parallel to the side walls 134, 136.

In an exemplary embodiment, the communication connector 112 is received in the cavity of the receptacle cage 110, such as proximate to the rear wall 138. However, in alternative embodiments, the communication connector 112 may be located behind the rear wall 138 exterior of the receptacle cage 110 and extend into the cavity 116 to interface with the pluggable module(s) 106. For example, the rear wall 138 may include an opening to receive components therethrough. The communication connector 112 is coupled to the circuit board 102. The receptacle cage 110 is mounted to the circuit board 102 over the communication connector 112.

In an exemplary embodiment, the pluggable module 106 is loaded into the receptacle cage 110 through the front end 140 to mate with the communication connector 112. The shielding cage walls 114 of the receptacle cage 110 provide electrical shielding around the communication connector 112 and the pluggable module 106, such as around the mating interface between the communication connector 112 and the pluggable modules 106. In an exemplary embodiment, the receptacle cage 110 includes a front EMI gasket 143, which may be metallic, at the front end 140 to interface with the pluggable module 106. The front EMI gasket 143 extends into the module channel 118 to at least partially fill the space between the cage walls 114 and the pluggable module 106 to prevent EMI leakage. The front EMI gasket 143 may be electrically connected to the receptacle cage 110 and electrically connected to the pluggable module 106. In various embodiments, the front EMI gasket 143 may extend around the exterior of the receptacle cage 110 at the front end 140 to interface with a panel (not shown) and prevent EMI leakage through the panel.

In an exemplary embodiment, the receptacle connector assembly 104 may include one or more heat sinks 144 for dissipating heat from the pluggable module(s) 106. For example, the heat sink 144 may be coupled to the top wall 130. The heat sink 144 includes a base 146 facing the pluggable module 106. The base 146 includes a thermal interface configured to be thermally coupled to the pluggable module 106. The heat sink 144 extends through the opening 150 to engage the pluggable module 106 when the pluggable module 106 is received in the module channel 118. For example, the base 146 may extend into the opening 150 to engage the pluggable module 106. In various embodiments, the base 146 may include a platform at the bottom sized and shaped to fit into the opening 150 to engage the pluggable module 106. The heat sink 144 extends through the opening 150 to directly engage the pluggable module 106. In an exemplary embodiment, the heat sink 144 may be fixed relative to the cage walls 114. For example, the heat sink 144 may be fixed relative to the top wall 130. The heat sink 144 may be secured to the cage walls 114 by a clip, fasteners, welding, adhesive, or other securing means. In other various embodiments, the heat sink 144 may be movable relative to the cage walls 114. For example, a spring clip may be used to couple to the heat sink 144 to the cage walls 114 that allows the heat sink 144 to move relative to the top wall 130 (for example, move outward) when coupled to the pluggable module 106. The spring clip may impart a downward biasing force against the heat sink 144 to press the heat sink 144 into thermal contact with the pluggable module 106. The heat sink 144 may be a finned heat sink having heat dissipating fins (not shown) at the top of the heat sink 144 to dissipate heat into the air flowing around the heat sink 144. Other types of heat sinks may be provided in alternative embodiments. For example, the heat sink 144 may be a thermal bridge having a plurality of stacked plates or may be a cold plate having liquid cooling flowing therethrough for active cooling of the cold plate.

In an exemplary embodiment, the receptacle cage 110 includes an EMI gasket 200 (shown schematically in FIG. 1) coupled to the top wall 130 that is used to provide EMI shielding at the opening 150. The EMI gasket 200 provides EMI shielding between the receptacle cage 110 and the heat sink 144. The EMI gasket 200 may be located inside the module channel 118 to interface with the cage walls 114 and/or the pluggable module 106. The EMI gasket 200 may be located outside the receptacle cage 110 to interface with the heat sink 144. The EMI gasket 200 at least partially fills the space between the cage walls 114 and the heat sink 144 to prevent EMI leakage through the opening 150. The EMI gasket 200 may be electrically connected to the receptacle cage 110. The EMI gasket 200 may be electrically connected to the heat sink 144.

Figure 2:
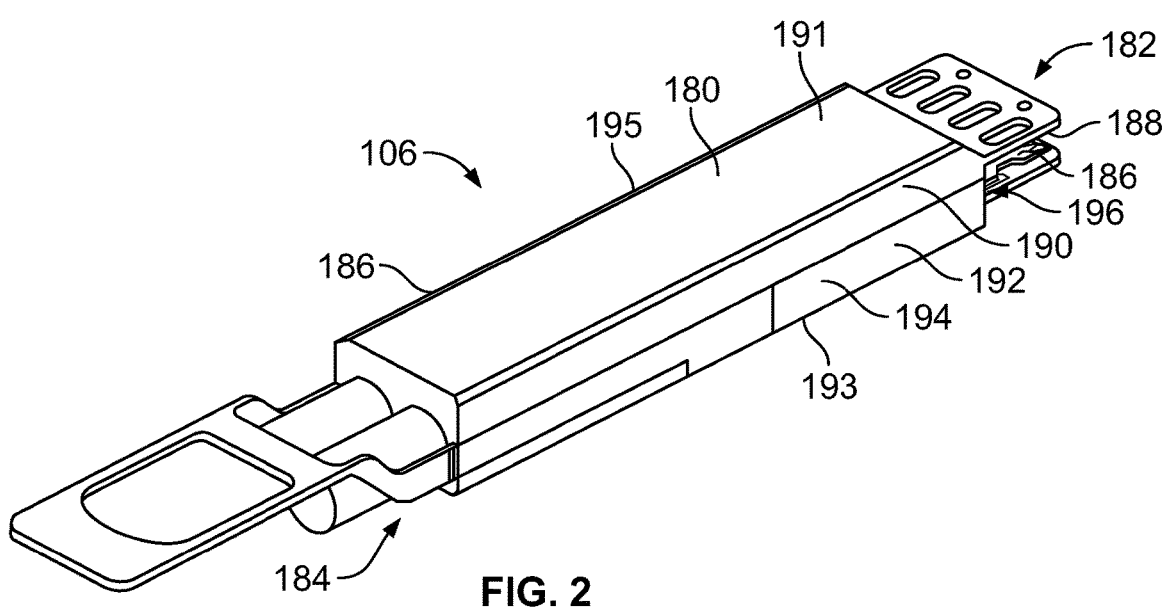
FIG. 2 is a front perspective view of a pluggable module for the communication system in accordance with an exemplary embodiment.

FIG. 2 is a front perspective view of the pluggable module 106 in accordance with an exemplary embodiment. The pluggable module 106 has a pluggable body 180, which may be defined by one or more shells. For example, the pluggable body 180 may include an upper shell 190 and a lower shell 192. The upper shell 190 includes a top wall 191. The lower shell 192 includes a bottom wall 193. The upper shell 190 and/or the lower shell 192 includes side walls 194, 195. The pluggable body 180 includes a cavity 196 defined between the upper shell 190 and the lower shell 192. In an exemplary embodiment, the pluggable body 180 may be thermally conductive and/or may be electrically conductive, such as to provide EMI shielding for the pluggable module 106. For example, the upper shell 190 and the lower shell 192 may be die cast shells manufactured from metal material, such as aluminum. The pluggable body 180 includes a mating end 182 and an opposite front end 184. The front end 184 may be a cable end having a cable extending therefrom to another component within the system. The mating end 182 is configured to be inserted into the corresponding module channel 118 (shown in FIG. 1).

The pluggable module 106 includes a module circuit board 186 that is configured to be communicatively coupled to the communication connector 112 (shown in FIG. 1). The module circuit board 186 has an edge 188 at the front end 184 configured to be plugged into a card slot of the communication connector 112 (shown in FIG. 1). Contact pads are provided at the edge 188, such as along the upper surface and the lower surface of the module circuit board 186 for electrical connection with contacts of the communication connector 112. The module circuit board 186 is received in the cavity 196 and surrounded by the upper shell 190 and the lower shell 192. The module circuit board 186 may be accessible at the mating end 182. The module circuit board 186 may include components, circuits and the like used for operating and/or using the pluggable module 106. For example, the module circuit board 186 may have conductors, traces, pads, electronics, sensors, controllers, switches, inputs, outputs, and the like associated with the module circuit board 186, which may be mounted to the module circuit board 186, to form various circuits.

In an exemplary embodiment, the pluggable body 180 provides heat transfer for the module circuit board 186, such as for the electronic components on the module circuit board 186. For example, the module circuit board 186 is in thermal communication with the upper shell 190 and/or the lower shell 192. The pluggable body 180 transfers heat from the module circuit board 186. In an exemplary embodiment, the upper shell 190 is configured to interface with the heat sink 144 (shown in FIG. 1) to dissipate heat from the pluggable module 106. In various embodiments, the pluggable body 180 may include a plurality of heat transfer fins (not shown) along at least a portion of the pluggable module 106, such as the top wall 191. The fins transfer heat away from the main shell of the pluggable body 180, and thus from the module circuit board 186 and associated components. In the illustrated embodiment, the fins are parallel plates that extend lengthwise; however, the fins may have other shapes in alternative embodiments, such as cylindrical or other shaped posts.

Figure 3:
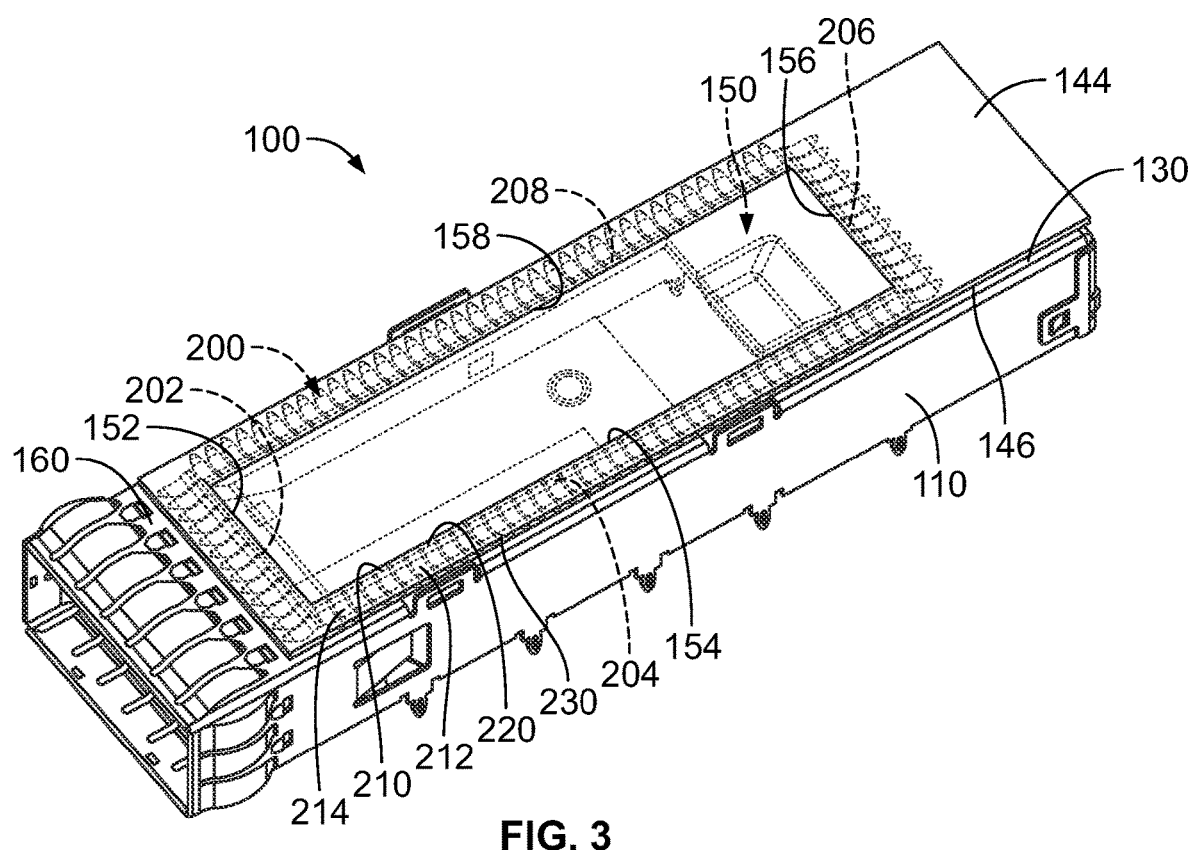
FIG. 3 is a top perspective view of a portion of the communication system showing a receptacle cage and a heat sink with an EMI gasket in accordance with an exemplary embodiment.

FIG. 3 is a top perspective view of a portion of the communication system 100 in accordance with an exemplary embodiment showing the receptacle cage 110 and the heat sink 144 with the EMI gasket 200 shown in phantom.

Figure 4:
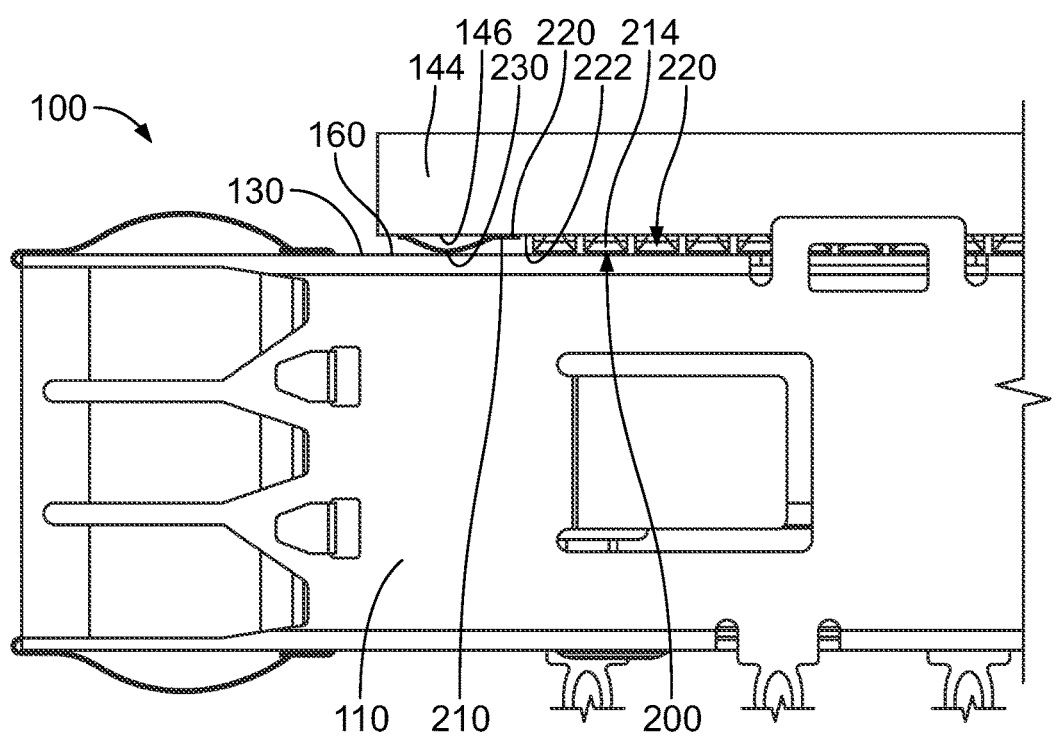
FIG. 4 is a side view of a portion of the communication system showing the receptacle cage and the heat sink with the EMI gasket in accordance with an exemplary embodiment.
Figure 5:
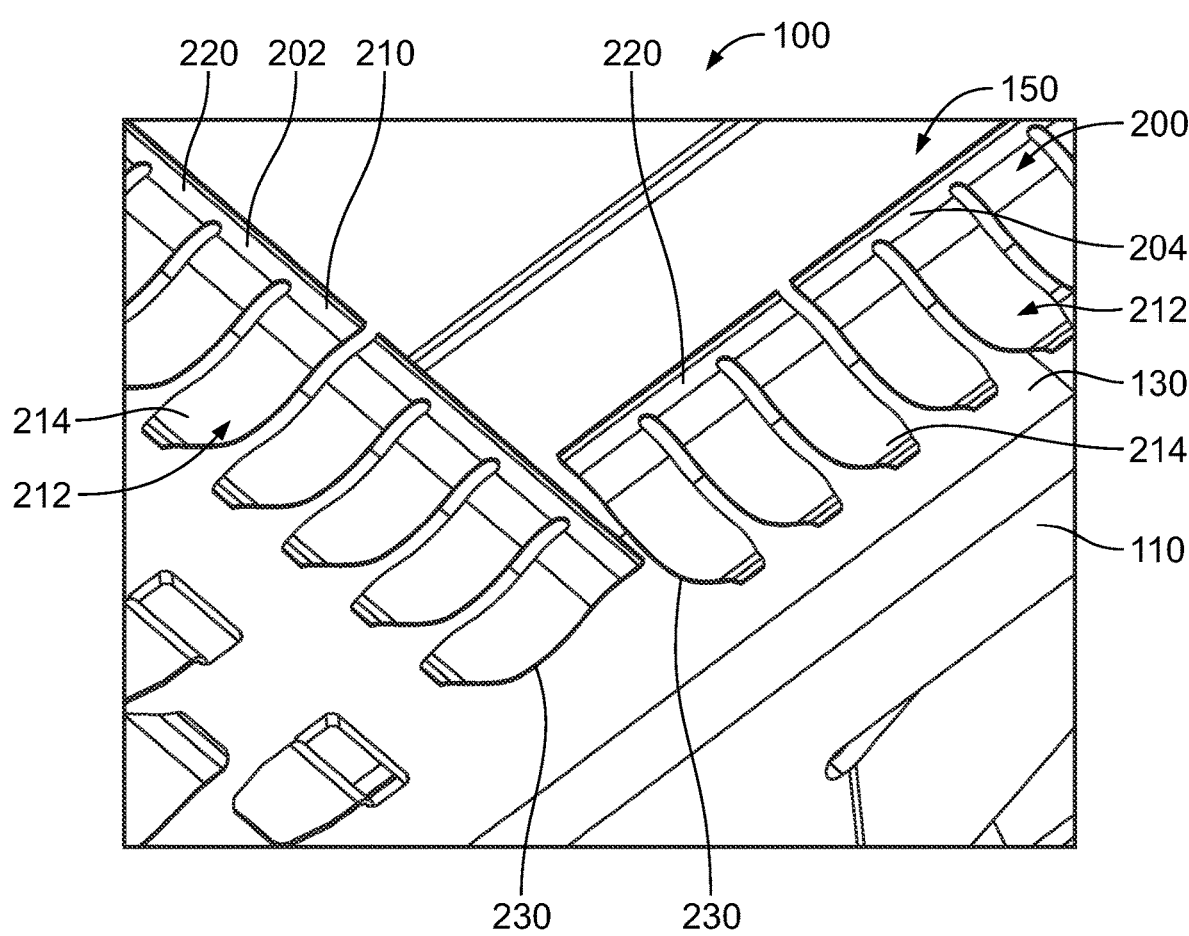
FIG. 5 is a top perspective view of a portion of the communication system showing the EMI gasket relative to the receptacle cage in accordance with an exemplary embodiment.

FIG. 4 is a side view of a portion of the communication system 100 showing the receptacle cage 110 and the heat sink 144 with the EMI gasket 200 in accordance with an exemplary embodiment. FIG. 5 is a top perspective view of a portion of the communication system 100 in accordance with an exemplary embodiment with the heatsink 144 removed for clarity to illustrate the EMI gasket 200 relative to the receptacle cage 110.

The EMI gasket 200 is shaped to surround the opening 150. In the illustrated embodiment, the EMI gasket 200 is rectangular shaped surrounding a front edge 152, a first side edge 154, a rear edge 156 and a second side edge 158 of the opening 150. For example, the EMI gasket 200 includes a front gasket element 202 at the front edge 152, a first side gasket element 204 at the first side edge 154, a rear gasket element 206 at the rear edge 156, and a second side gasket element 208 at the second side edge 158. The EMI gasket 200 may have other shapes in alternative embodiments. For example, the EMI gasket 200 may include greater or fewer gasket element in alternative embodiments. In various embodiments, the EMI gasket 200 may be a single piece gasket having the gasket elements integral as part of a monolithic structure. Alternatively, the EMI gasket 200 may be a multi-piece gasket having the gasket elements as separate pieces. In an exemplary embodiment, the EMI gasket 200 is a metallic stamped and formed gasket. Other types of gaskets may be used in alternative embodiments, such as a metallic wire mesh, a conductive polymer, and the like.

The EMI gasket 200 includes a base 210 and shielding members 212 extending from the base 210. For example, each gasket element 202, 204, 206, 204 may have a corresponding base 210 and shielding members 212 extending from the corresponding base 210. The base 210 physically connects the shielding members 212 to hold the relative positions of the shielding members 212. The shielding members 212 may be cantilevered from the base 210. In an exemplary embodiment, the shielding members 212 include spring fingers 214. The shielding members 212 are deflectable relative to the base 210. For example, the shielding members 212 may be compressed against the receptacle cage 110 and/or the heat sink 144.

In an exemplary embodiment, the EMI gasket 200 is coupled to the heat sink 144. For example, the base 210 includes a mounting surface 220 coupled to the heat sink 144. The mounting surface 220 may be fixed to the heat sink 144. The mounting surface 220 may be soldered to the heat sink 144 in various embodiments. The mounting surface 220 may be secured by other means, such as welding, conductive adhesive, fasteners, clips or other securing means. In the illustrated embodiment, the mounting surface 220 is a top surface of the base 210 coupled to a mounting surface 222 of the heat sink 144 (for example, a downward facing surface of the base 146 of the heat sink 144).

The EMI gasket 200 includes mating interfaces 230 remote from the mounting surface 220. In an exemplary embodiment, the shielding members 212 (for example, the spring fingers 214) include the mating interfaces 230. The mating interfaces 230 are configured to engage the receptacle cage 110. For example, the mating interfaces 230 are configured to engage an outer surface 160 of the top wall 130. The mating interfaces 230 are separable mating interfaces. The mating interfaces 230 are compressed against the top wall 130. The shielding members 212 substantially fill a space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

Figure 6:
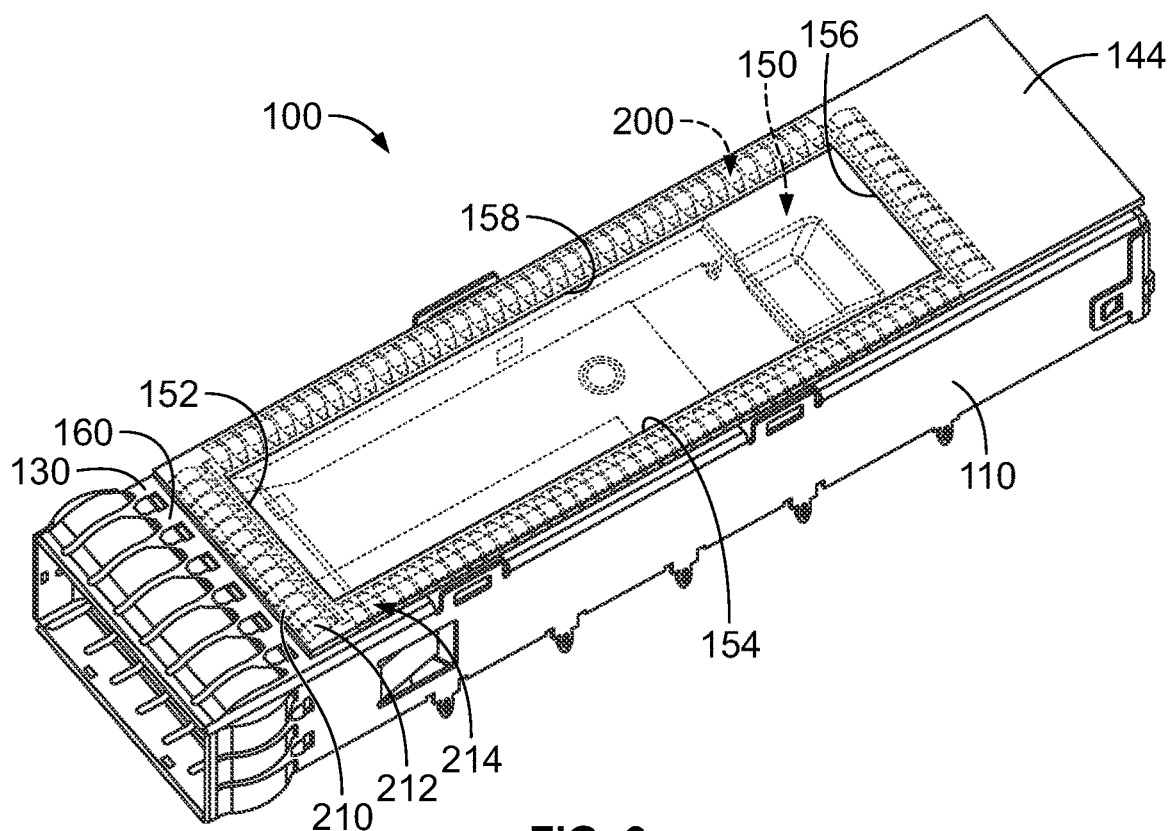
FIG. 6 is a top perspective view of a portion of the communication system showing the receptacle cage and the heat sink with the EMI gasket in accordance with an exemplary embodiment.
Figure 7:
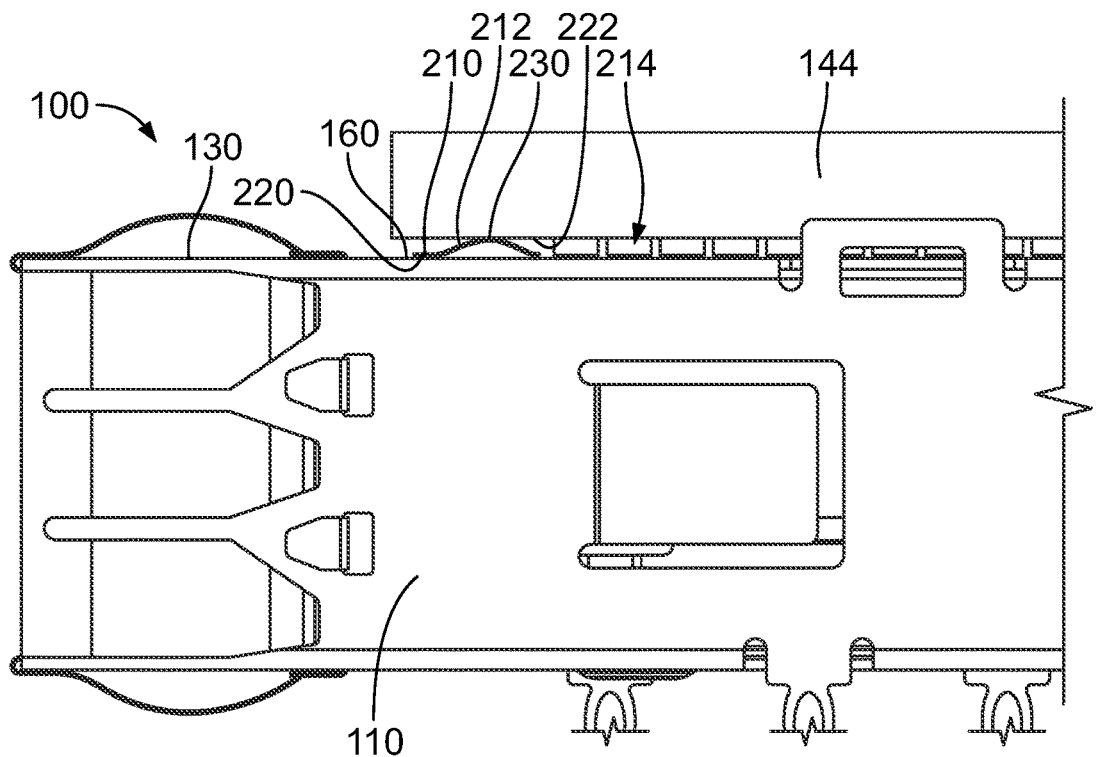
FIG. 7 is a side view of a portion of the communication system showing the receptacle cage and the heat sink with the EMI gasket in accordance with an exemplary embodiment.

FIG. 6 is a top perspective view of a portion of the communication system 100 in accordance with an exemplary embodiment showing the receptacle cage 110 and the heat sink 144 with the EMI gasket 200 shown in phantom. FIG. 7 is a side view of a portion of the communication system 100 showing the receptacle cage 110 and the heat sink 144 with the EMI gasket 200 in accordance with an exemplary embodiment. FIGS. 6 and 7 illustrate the EMI gasket 200 coupled to the top wall 130 of the receptacle cage 110 rather than the heat sink 144. For example, the EMI gasket 200 is inverted relative to the embodiment illustrated in FIG. 3.

The EMI gasket 200 surrounds the opening 150. The base 210 of the EMI gasket 200 is mounted to the top wall 130 around the front edge 152, the first side edge 154, the rear edge 156 and the second side edge 158. In an exemplary embodiment, the mounting surface 220 of the base 210 is coupled to the outer surface 160 of the top wall 130. The mounting surface 220 may be fixed to the top wall 130. The mounting surface 220 may be soldered to the top wall 130 in various embodiments. The mounting surface 220 may be secured by other means, such as welding, conductive adhesive, fasteners, clips or other securing means. In the illustrated embodiment, the mounting surface 220 is a bottom surface of the base 210 coupled to the outer surface 160 of the heat sink 144.

The shielding members 212 extend from the base 210 to engage the heat sink 144. The mating interfaces 230 of the shielding members 212 (for example, the spring fingers 214) are configured to engage the heat sink 144. For example, the mating interfaces 230 are configured to engage the mounting surface 222 of the heat sink 144. The mating interfaces 230 are separable mating interfaces. The mating interfaces 230 are compressed against the heat sink 144. The shielding members 212 substantially fill a space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

Figure 8:
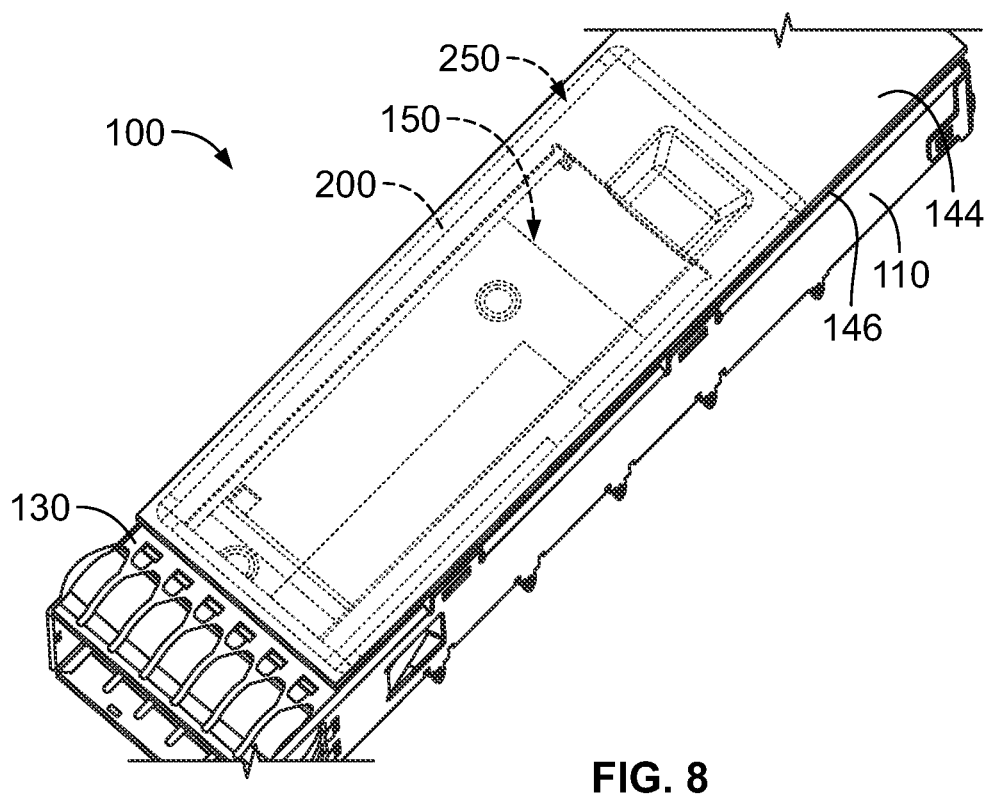
FIG. 8 is a top perspective view of a portion of the communication system showing the receptacle cage and the heat sink with the EMI gasket in accordance with an exemplary embodiment.

FIG. 8 is a top perspective view of a portion of the communication system 100 in accordance with an exemplary embodiment showing the receptacle cage 110 and the heat sink 144 with the EMI gasket 200 shown in phantom. FIG. 8 illustrates the EMI gasket 200 including a metallic wire mesh gasket 250 rather than a stamped and formed structure with deflectable spring fingers. The wire mesh gasket 250 surrounds the opening 150. The wire mesh gasket 250 may be coupled to the top wall 130 or the base 146 of the heat sink 144. For example, the mounting surface 220 of the wire mesh gasket 250 may be fixed to the top wall 130 (or may be fixed to the heat sink 144). The wire mesh gasket 250 substantially fills the space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

Figure 9:
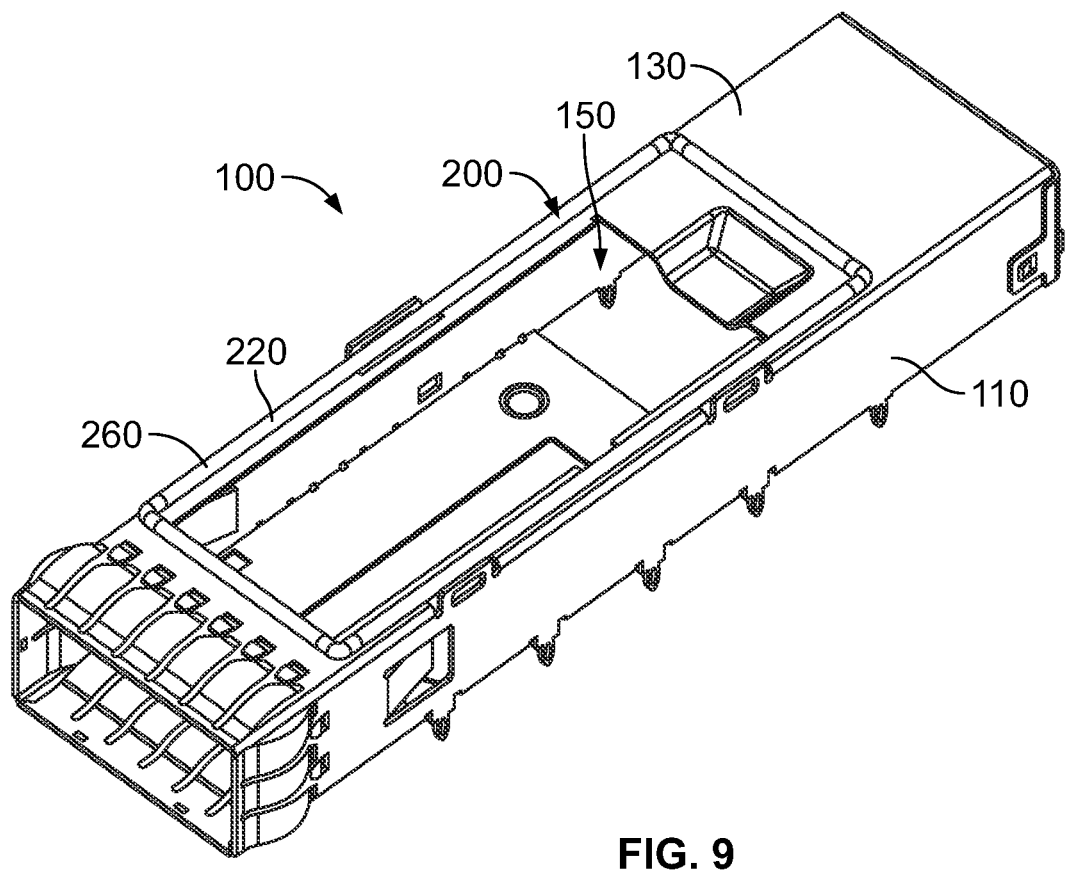
FIG. 9 is a top perspective view of a portion of the communication system showing the receptacle cage and the heat sink with the EMI gasket in accordance with an exemplary embodiment.

FIG. 9 is a top perspective view of a portion of the communication system 100 in accordance with an exemplary embodiment showing the receptacle cage 110 and the EMI gasket 200 with the heatsink 144 removed. FIG. 9 illustrates the EMI gasket 200 including a conductive elastomeric gasket 260 rather than a stamped and formed structure or wire mesh. The conductive elastomeric gasket 260 surrounds the opening 150. The conductive elastomeric gasket 260 may be coupled to the top wall 130 or the base 146 of the heat sink 144. For example, the mounting surface 220 of the conductive elastomeric gasket 260 may be fixed to the top wall 130 (or may be fixed to the heat sink 144). The conductive elastomeric gasket 260 substantially fills the space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

Figure 10:
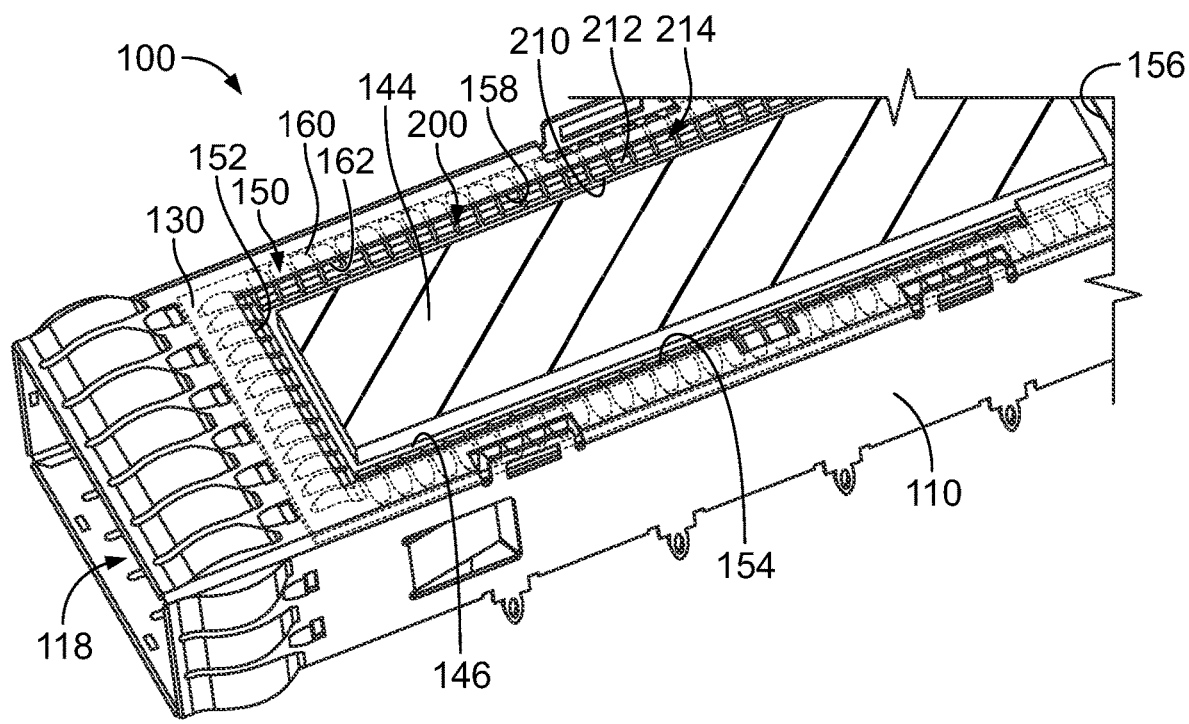
FIG. 10 is a top perspective view of a portion of the communication system showing the receptacle cage and the heat sink with the EMI gasket therebetween in accordance with an exemplary embodiment.
Figure 11:
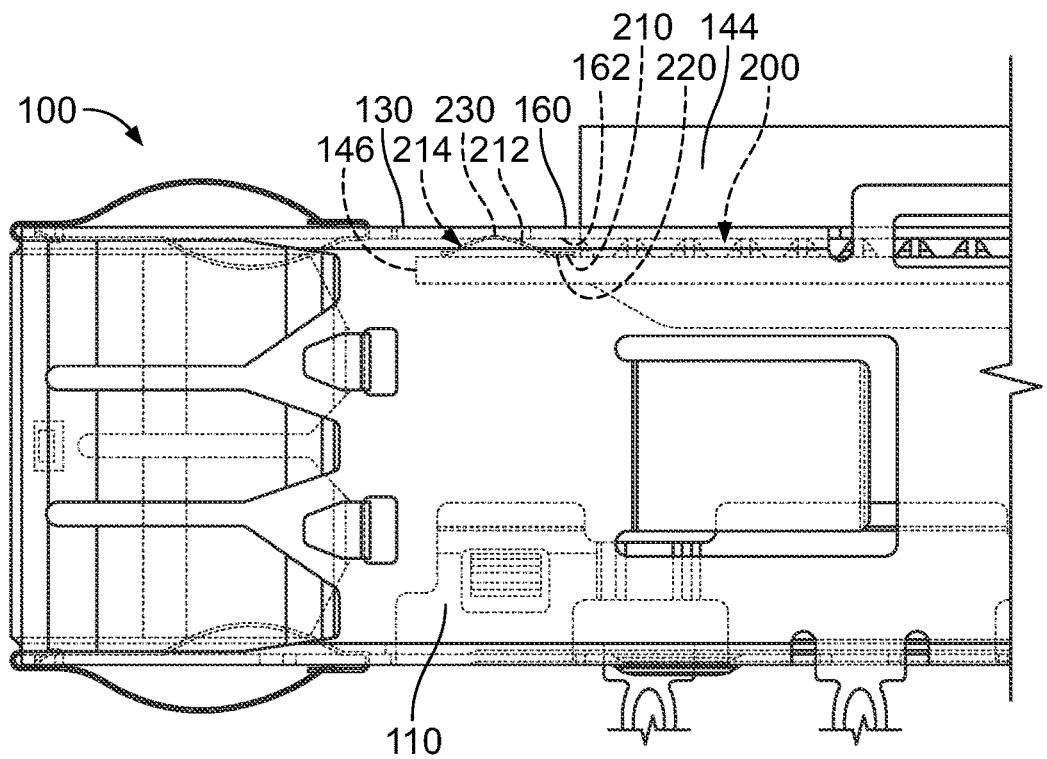
FIG. 11 is a side view of a portion of the communication system showing the receptacle cage and the heat sink with the EMI gasket in accordance with an exemplary embodiment.

FIG. 10 is a top perspective view of a portion of the communication system 100 in accordance with an exemplary embodiment showing the receptacle cage 110 and the heat sink 144 with the EMI gasket 200 therebetween. FIG. 11 is a side view of a portion of the communication system 100 showing the receptacle cage 110 and the heat sink 144 with the EMI gasket 200 in accordance with an exemplary embodiment. A portion of the heat sink 144 is shown in phantom. FIGS. 10 and 11 illustrate the EMI gasket 200 coupled to an inner surface 162 of the top wall 130 rather than the outer surface 160. The EMI gasket 200 is located between the top wall 130 and the heat sink 144.

In an exemplary embodiment, a portion of the heat sink 144 is located inside the module channel 118. For example, the base 146 of the heat sink 144 is inside the module channel 118 to interface with the pluggable module 106. The base 146 of the heat sink 144 is located below the top wall 130. A heat dissipating portion of the heat sink 144 is located outside of the receptacle cage 110. For example, the heat dissipating fins of the heat sink 144 extend through the opening 150 to an exterior of the receptacle cage 110.

The EMI gasket 200 surrounds the opening 150. The base 210 of the EMI gasket 200 is mounted to the inner surface 162 of the top wall 130 around the front edge 152, the first side edge 154, the rear edge 156 and the second side edge 158. In an exemplary embodiment, the mounting surface 220 of the base 210 is coupled to the inner surface 162 of the top wall 130. The mounting surface 220 may be fixed to the top wall 130. The mounting surface 220 may be soldered to the top wall 130 in various embodiments. The mounting surface 220 may be secured by other means, such as welding, conductive adhesive, fasteners, clips or other securing means. In the illustrated embodiment, the mounting surface 220 is a top surface of the base 210 coupled to the inner surface 162 of the heat sink 144.

The shielding members 212 extend from the base 210 to engage the heat sink 144. The shielding members 212 of the EMI gasket 200 extend into and/or through the opening 150 from the interior of the module channel 118 to an exterior of the receptacle cage 110. The mating interfaces 230 of the shielding members 212 (for example, the spring fingers 214) are configured to engage an upper surface of the base 146 of the heat sink 144. The mating interfaces 230 are separable mating interfaces. The mating interfaces 230 are compressed against the heat sink 144. For example, the heat sink 144 may be pressed upward against the shielding members 212 to compress the shielding members 212 when the pluggable module 106 is plugged into the receptacle cage 110. The shielding members 212 substantially fill a space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

Figure 12:
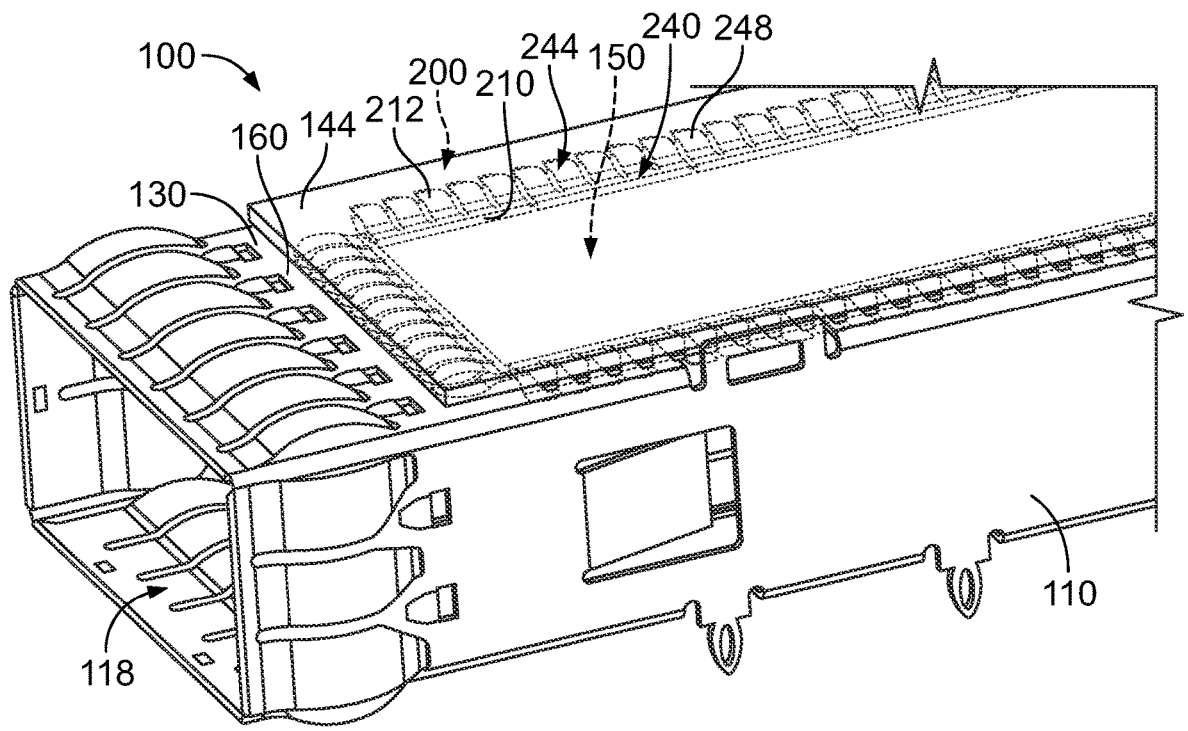
FIG. 12 is a top perspective view of a portion of the communication system showing the receptacle cage and the heat sink with the EMI gasket therebetween in accordance with an exemplary embodiment.
Figure 13:
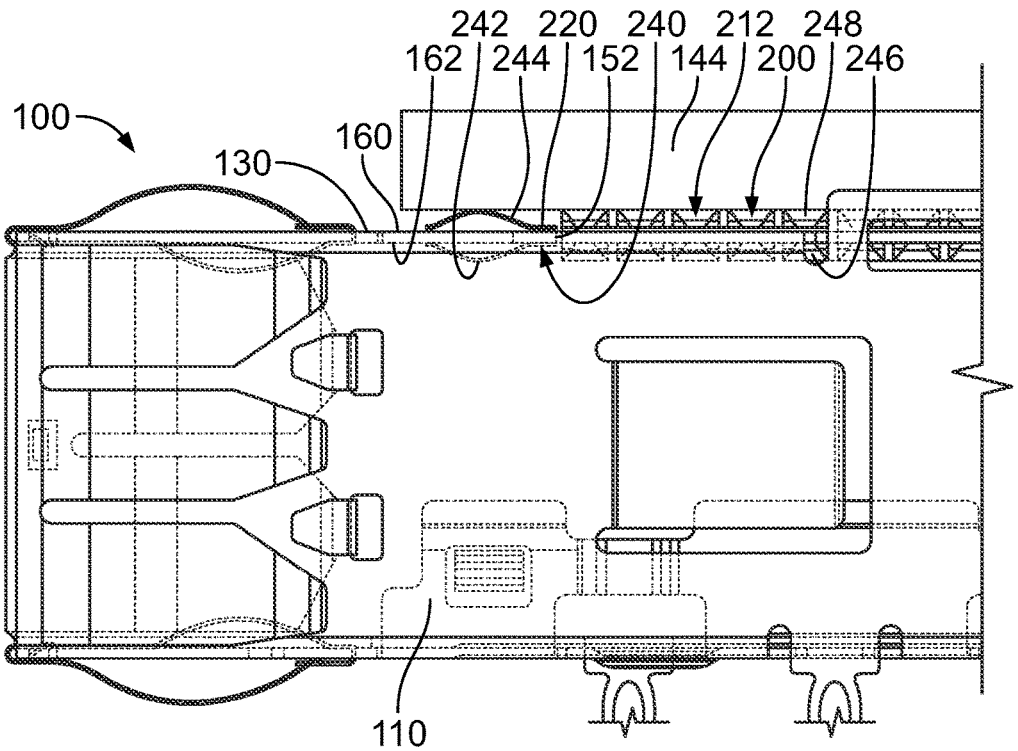
FIG. 13 is a side view of a portion of the communication system showing the receptacle cage and the heat sink with the EMI gasket in accordance with an exemplary embodiment.

FIG. 12 is a top perspective view of a portion of the communication system 100 in accordance with an exemplary embodiment showing the receptacle cage 110 and the heat sink 144 with the EMI gasket 200 therebetween. FIG. 13 is a side view of a portion of the communication system 100 showing the receptacle cage 110 and the heat sink 144 with the EMI gasket 200 in accordance with an exemplary embodiment. FIGS. 12 and 13 illustrate the EMI gasket 200 interior and exterior of the receptacle cage 110.

The EMI gasket 200 includes one or more clips 240 configured to be clipped onto the top wall 130. Each clip 240 is provided at the base 210 of the EMI gasket 200. In an exemplary embodiment, the shielding members 212 of the EMI gasket 200 include inner shielding members 242 extending along the inner surface 162 of the top wall 130 and outer shielding members 244 extending along the outer surface 160 of the top wall 130. In various embodiments, the inner shielding members 242 include inner spring fingers 246 extending from the base 210 and the outer shielding members 244 include outer spring fingers 248 extending from the base 210. The spring fingers 246, 248 are deflectable spring fingers. The inner shielding members 242 extend from a top of the base 210 and the outer shielding members 244 extend from a bottom of the base 210. The inner shielding members 242 are located exterior of the receptacle cage 110. The outer shielding members 244 are located interior of the receptacle cage 110. The EMI gasket 200 surrounds the opening 150 with the inner and outer shielding members 242, 244 extending along the front edge 152, the first side edge 154, the rear edge 156 and the second side edge 158.

In an exemplary embodiment, the mounting surface 220 of the base 210 is coupled to the top wall 130. For example, the clip 240 may be clipped directly onto the top wall 130 at the edges 152, 154, 156, 158. The mounting surface 220 may be fixed to the top wall 130. The outer shielding members 244 extend from the base 210 to engage the heat sink 144. The inner shielding members 242 of the EMI gasket 200 extend into and/or through the opening 150 into the module channel 118 and may engage the pluggable module 106. The shielding members 242, 244 may be compressed when engaging the heat sink 144 or the pluggable module 106. The shielding members 242, 244 substantially fill a space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

Figure 14:
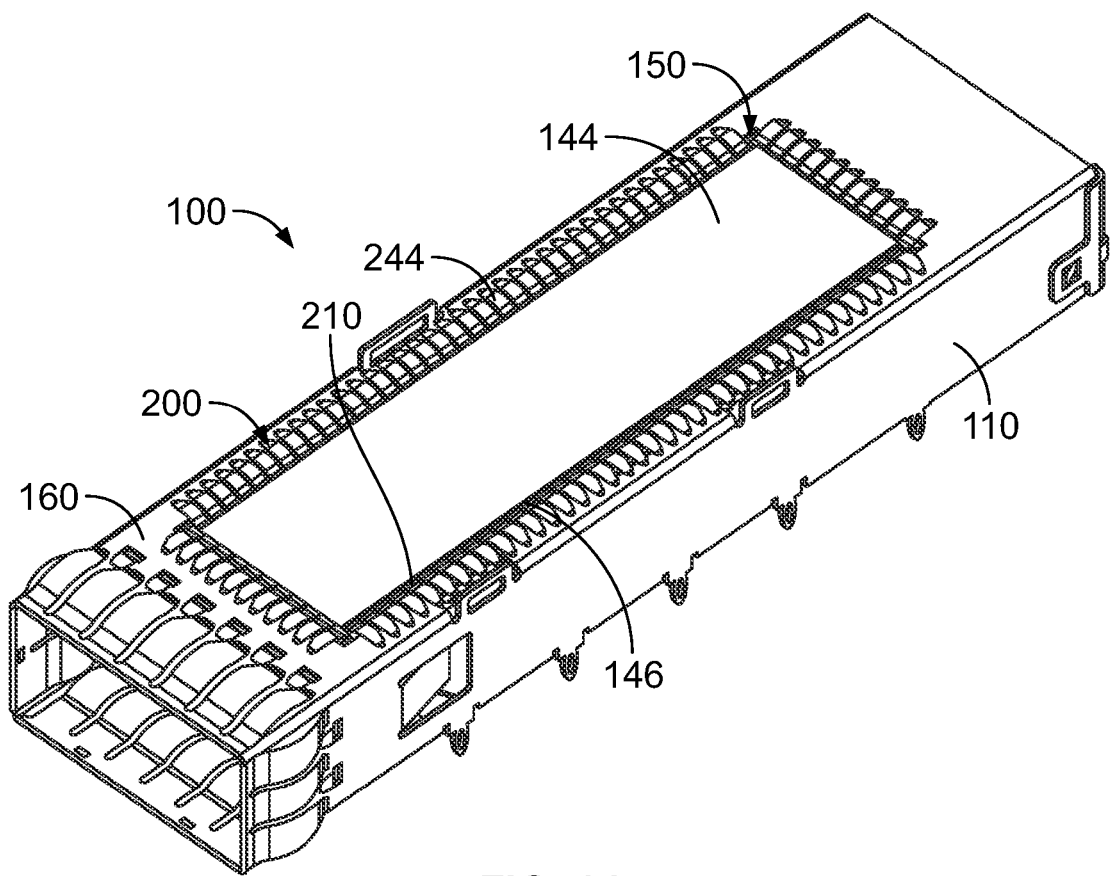
FIG. 14 is a top perspective view of a portion of the communication system showing the receptacle cage and the heat sink with the EMI gasket therebetween in accordance with an exemplary embodiment.
Figure 15:
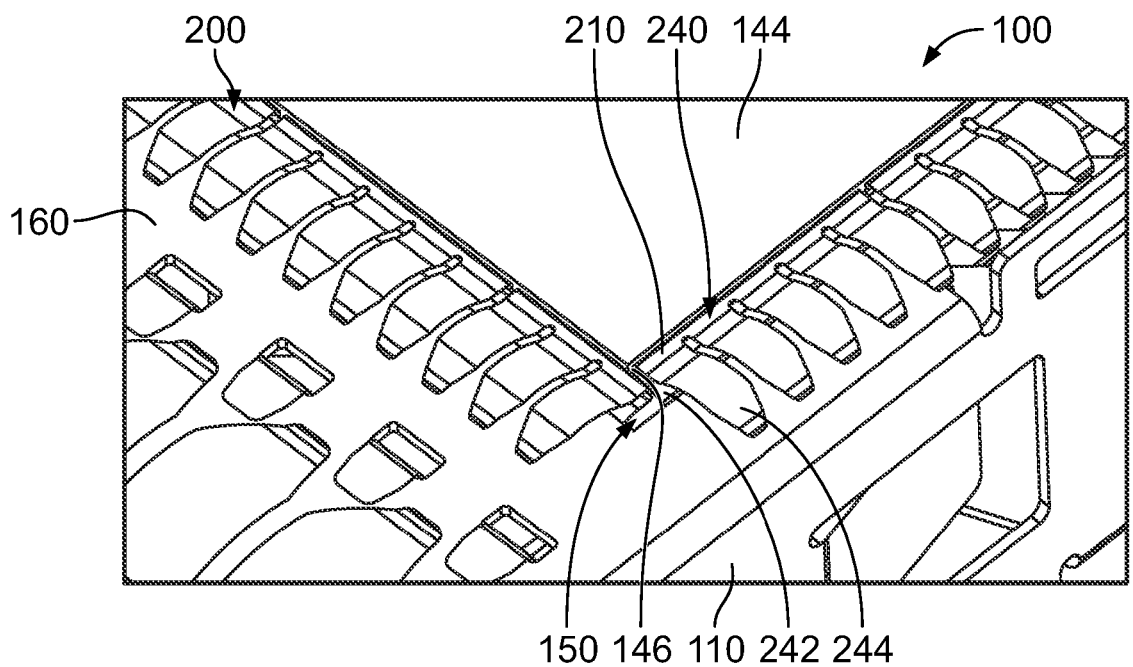
FIG. 15 is a side view of a portion of the communication system showing the receptacle cage and the heat sink with the EMI gasket in accordance with an exemplary embodiment.
Figure 16:
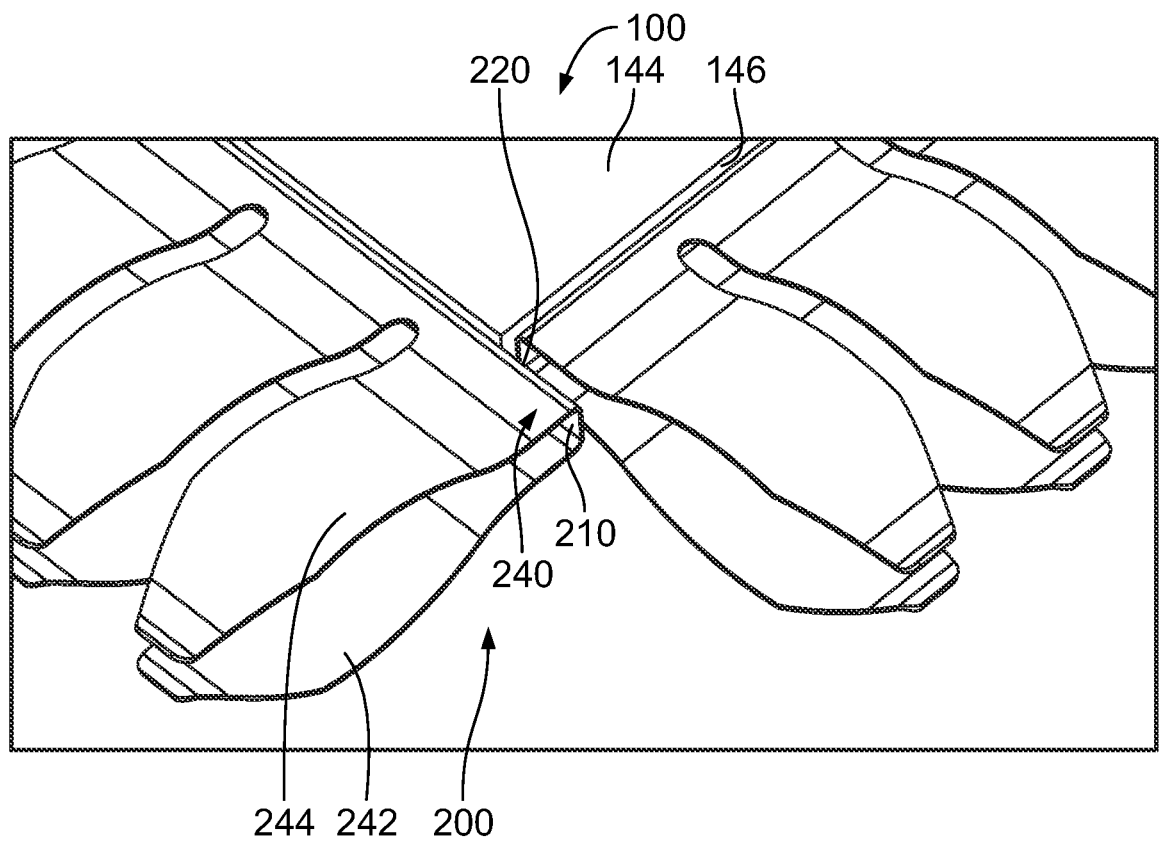
FIG. 16 is a perspective view of a portion of the communication system in accordance with an exemplary embodiment showing the EMI gasket coupled to the heatsink.

FIG. 14 is a top perspective view of a portion of the communication system 100 in accordance with an exemplary embodiment showing the receptacle cage 110 and the heat sink 144 with the EMI gasket 200 therebetween. FIG. 15 is a side view of a portion of the communication system 100 showing the receptacle cage 110 and the heat sink 144 with the EMI gasket 200 in accordance with an exemplary embodiment. FIG. 16 is a perspective view of a portion of the communication system 100 in accordance with an exemplary embodiment showing the EMI gasket 200 coupled to the heatsink 144 (an upper portion of the heatsink 144 is removed to show the EMI gasket 200. FIGS. 14 and 15 illustrate the EMI gasket 200 interior and exterior of the receptacle cage 110. The EMI gasket 200 is coupled to the heat sink 144 rather than being coupled to the top wall 130 as illustrated in FIGS. 12 and 13.

The clip 240 of the EMI gasket 200 is secured to the base 146 of the heat sink 144. The heat sink 144 may be manipulated relative to the cage top wall 130 to fit the shielding members 242 into the interior of the receptacle cage 110 through the opening 150. The shielding members 242 may be bent or otherwise manipulated to fit into the opening 150. The mounting surface 220 of the base 210 is coupled to the base 146 of the heat sink 144. The inner shielding members 242 extend from the clip 240 along the inner surface 162 of the top wall 130 and the outer shielding members 244 extend from the clip 240 along the outer surface 160 of the top wall 130. The EMI gasket 200 is positioned such that the shielding members 242, 244 substantially fill a space between the receptacle cage 110 and the heat sink 144 to provide EMI shielding around the opening 150. The EMI shielding protects the components of the communication system 100 and surrounding electrical components. The EMI shielding may enhance electrical performance of the communication system 100 by reducing EMI susceptibility and reducing crosstalk.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle connector assembly comprising:
a receptacle cage including cage walls including a top wall, the cage walls forming a module channel configured to receive a pluggable module, the cage walls extending between a front end and a rear end of the receptacle cage, the top wall including an opening open to the pluggable module;
an EMI gasket coupled to the top wall at the opening, the EMI gasket providing electrical shielding at the opening, the EMI gasket having a base including a mounting surface, the mounting surface of the base of the EMI gasket being mounted to the top wall of the receptacle cage, the EMI gasket having shielding members extending from the base and being flexible relative to the base, each shielding member having a mating interface; and
a heat sink coupled to the receptacle cage, the heat sink including a heat sink base having a thermal interface, the thermal interface located in the module channel and configured to engage the pluggable module to dissipate heat from the pluggable module, the heat sink base engaging the shielding members at the mating interfaces of the EMI gasket to electrically connect the heat sink to the EMI gasket, wherein the heat sink is separable from the EMI gasket when the heat sink is removed from the receptacle cage.

2. The receptacle connector assembly of claim 1, wherein the mating interfaces of the EMI gasket are compressible when engaging the heat sink.

3. The receptacle connector assembly of claim 1, wherein the base is fixed to the top wall, the mating interfaces being separable mating interfaces.

4. The receptacle connector assembly of claim 1, wherein the EMI gasket includes spring fingers extending from the base, the spring fingers including the mating interfaces.

5. The receptacle connector assembly of claim 1, wherein the EMI gasket includes a wire mesh body.

6. The receptacle connector assembly of claim 1, wherein the EMI gasket includes a conductive elastomeric body.

7. The receptacle connector assembly of claim 1, wherein the EMI gasket is coupled to an inner surface of the top wall.

8. The receptacle connector assembly of claim 1, wherein the EMI gasket extends through the opening from an interior of the module channel to an exterior of the receptacle cage.

9. The receptacle connector assembly of claim 1, wherein the base includes a clip being clipped to the top wall at the opening.

10. The receptacle connector assembly of claim 1, wherein the EMI gasket includes inner shielding members extending along an inner surface of the top wall and outer shielding members extending along an outer surface of the top wall.

11. The receptacle connector assembly of claim 10, wherein the inner shielding members include inner spring fingers extending from the base and the outer shielding members include outer spring fingers extending from the base.

12. The receptacle connector assembly of claim 1, wherein the base of the heat sink is located inside the module channel below the top wall, the EMI gasket being located between the top wall and the heat sink.

13. A receptacle connector assembly comprising:
a receptacle cage including cage walls including a top wall, the cage walls forming a module channel configured to receive a pluggable module, the cage walls extending between a front end and a rear end of the receptacle cage, the top wall including an opening open to the pluggable module, the top wall including an inner surface and an outer surface, the inner surface facing the module channel; and
an EMI gasket electrically coupled to the top wall and configured to be electrically coupled to a heat sink, the EMI gasket surrounding the opening to provide electrical shielding at the opening, the EMI gasket having a base and shielding members extending from the base, the shielding members being flexible relative to the base, each shielding member having a mating interface, the EMI gasket extending into the module channel.

14. The receptacle connector assembly of claim 13, wherein the base of the EMI gasket includes a mounting surface coupled to the top wall of the receptacle cage.

15. The receptacle connector assembly of claim 13, wherein the EMI gasket includes spring fingers extending from the base, the spring fingers including mating interfaces.

16. The receptacle connector assembly of claim 13, wherein the EMI gasket is coupled to an inner surface of the top wall.

17. The receptacle connector assembly of claim 13, wherein the EMI gasket extends through the opening from an interior of the module channel to an exterior of the receptacle cage.

18. The receptacle connector assembly of claim 13, wherein the EMI gasket includes inner shielding members extending along an inner surface of the top wall and outer shielding members extending along an outer surface of the top wall.

19. A communication system comprising:
a pluggable module including an outer housing extending between a mating end and a cable end, the pluggable module including an upper wall and a lower wall, the pluggable module having a cavity between the upper wall and the lower wall, the pluggable module having a module circuit card in the cavity including a card edge proximate to the mating end of the outer housing;
a receptacle connector assembly including a receptacle cage having cage walls forming a module channel receiving the pluggable module, the cage walls including a top wall having an opening, the cage walls extending between a front end and a rear end of the receptacle cage, the receptacle connector assembly including a communication connector having a card slot received in the receptacle cage proximate to the rear end, the pluggable module being loaded into the module channel to mate the card edge of the module circuit card with the communication connector, the receptacle connector assembly including an EMI gasket coupled to the top wall at the opening providing electrical shielding at the opening, the EMI gasket having a base including a mounting surface, the mounting surface of the base of the EMI gasket being coupled to the top wall of the receptacle cage, the EMI gasket having shielding members extending from the base and being flexible relative to the base, each shielding member having a mating interface, the receptacle connector assembly including a heat sink coupled to the receptacle cage, the heat sink including a heat sink base having a thermal interface, the thermal interface located in the module channel to engage the pluggable module to dissipate heat from the pluggable module, the heat sink base engaging the mating interfaces of the EMI gasket to electrically connect the heat sink to the EMI gasket, wherein the heat sink is separable from the EMI gasket when the heat sink is removed from the receptacle cage.

20. The communication system of claim 19, wherein the EMI gasket extends into the module channel to engage at least one of the top wall and the heat sink in the module channel.

* * * * *